United States Patent [19]
Del Vecchio et al.

[11] Patent Number: 6,069,780
[45] Date of Patent: May 30, 2000

[54] ELECTRONIC TRIP DEVICE COMPRISING, IN SERIES, FINITE AND INFINITE IMPULSE RESPONSE FILTERS

[75] Inventors: Alain Del Vecchio, Eybens; Hong Nguyen, Grenoble, both of France

[73] Assignee: Scheinder Electric Sa, France

[21] Appl. No.: 08/976,451

[22] Filed: Nov. 25, 1997

[30] Foreign Application Priority Data

Dec. 23, 1996 [FR] France .................................. 96 16152

[51] Int. Cl.[7] .................................................. H02H 3/00
[52] U.S. Cl. ............................................. 361/93.1; 361/97
[58] Field of Search .............................. 361/78, 87, 93.1, 361/93.2, 94, 96, 97, 98

[56] References Cited

FOREIGN PATENT DOCUMENTS 0603088  6/1994  European Pat. Off. ......... H02H 3/34
92/04635  3/1992  WIPO ............................. G01R 27/16

OTHER PUBLICATIONS

Proceedings of 1979 ISCAS, "Hybrid Implementation of Narrow Band Digital Filters," by Martinez et al. pp. 364–365. No Month.

Patent Abstracts of Japan, vol. 16, No. 120, JP 3–289270. Dec. 19, 1991.

*Primary Examiner*—Ronald W. Leja
*Attorney, Agent, or Firm*—Parkhurst & Wendel, LLP

[57] ABSTRACT

The electronic trip device comprises in series for each phase of a power system a sampler, a squaring circuit and a finite impulse response (FIR) filter. A maximum circuit is connected to the output of the FIR filters and to the input of an infinite impulse response filter. A comparison circuit for comparison to thresholds is connected to the output of the IIR filter. It is thus possible to obtain both a good precision and good filtering of the harmonics of the frequencies of conventional power systems (50 Hz, 60 Hz and 400 Hz), and to reduce the necessary computing power, and consequently the cost of the trip device.

8 Claims, 7 Drawing Sheets

ELECTRONIC TRIP DEVICE COMPRISING, IN SERIES, FINITE AND INFINITE IMPULSE RESPONSE FILTERS

BACKGROUND OF THE INVENTION

The invention relates to an electronic trip device connected to means for measuring the current flowing in a polyphase electrical power system to be protected and comprising means for sampling current signals supplied by the means for measuring, means for calculating connected to the means for sampling and calculating a quantity representative of the thermal state of the power system, and means for comparing said quantity to preset tripping thresholds, the means for calculating comprising first means for filtering, of the finite impulse response filter type, receiving the current signal samples and supplying signals representative of the rms value of the current.

In certain known microprocessor-based electronic trip devices, certain tripping functions, notably long delay tripping, are achieved by means of a digital finite impulse response (FIR) filter. Such a filter enables a predetermined number of samples to be summed. If the input samples of the filter are constituted by the squares of the samples representative of the measured current, signals representative of the rms value of the measured current are obtained on output. This type of filter does not however always enable the required frequency response to be obtained in so far as the harmonics are not sufficiently attenuated and it does not enable a representation of the thermal state of the installation to be had.

In other known electronic trip devices, a digital infinite impulse response (IIR) filter is used in order to model the thermal state of the installation. If the sampling frequency is sufficiently high, the results obtained are satisfactory. As an example, a filter of this type proves satisfactory for a sampling frequency of 1600 Hz for conventional power systems at 50 Hz, 60 Hz or 400 Hz. If, on the other hand, an inexpensive microprocessor is to be used, which means that the sampling frequency has to be limited, the results obtained are not satisfactory as far as accuracy of measurement is concerned.

SUMMARY OF THE INVENTION

The object of the invention is to achieve an inexpensive trip device enabling satisfactory results to be obtained for both filtering and modeling of the thermal state.

According to the invention, this object is achieved by a trip device according to an embodiment disclosed herein.

BRIEF DESCRIPTION OF THE DRAWINGS

Other advantages and features will become more clearly apparent from the following description of particular embodiments of the invention given as non-restrictive examples only and represented in the accompanying drawings in which.

DETAILED DESCRIPTION OF THE PREFERRED EMBODIMENT

Figure 1:
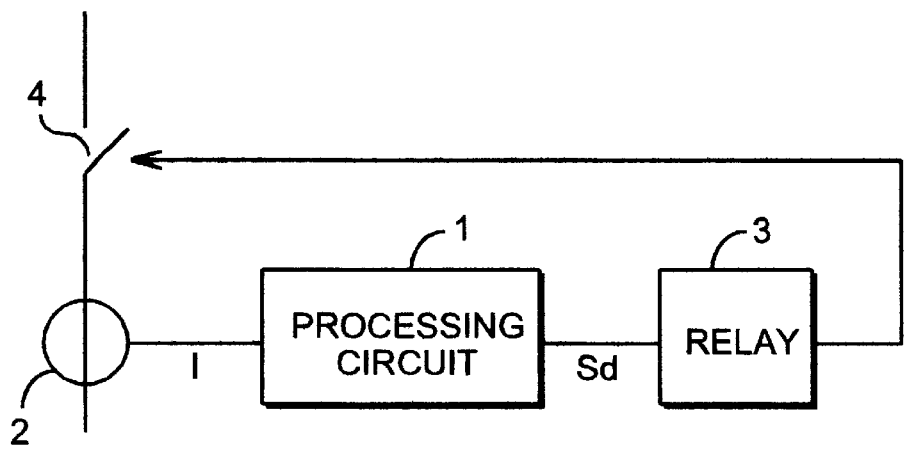
FIG. 1 illustrates, in block diagram form, a trip device of known type.

In FIG. 1, the trip device comprises a microprocessor-based processing circuit 1 receiving input signals representative of the current I flowing in an electrical power system to be protected. To simplify the explanations, in FIG. 1, the electrical power system is represented schematically in the form of a single-phase power system and a current sensor 2 supplies the signals I to the trip device. In the event of a fault in the power system, the processing circuit 1 supplies, possibly after a suitable time delay, tripping signals Sd to a relay 3 which triggers opening of a circuit breaker 4 and interruption of the current flow in the power system.

Figure 2:
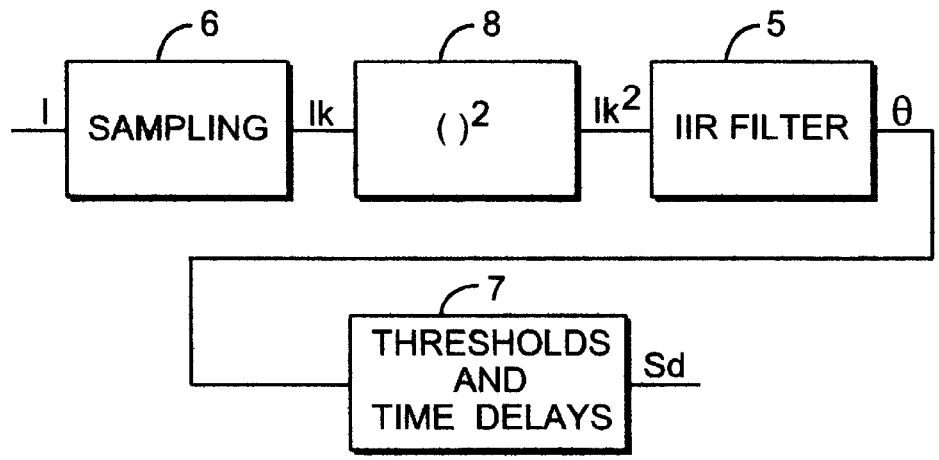
FIGS. 2 and 3 represent, schematically, particular embodiments of the processing circuit of the trip device according to FIG. 1, respectively with an infinite impulse response filter (FIG. 2) and with a finite impulse response filter (FIG. 3).

The particular embodiment of the processing circuit according to the prior art illustrated in FIG. 2 comprises a digital infinite impulse filter 5, or IIR filter. The current signals I are applied to the input of a sampling circuit 6 which supplies current samples Ik as an output. The input of the IIR filter is connected to the output of the sampling circuit 6 by means of a squaring circuit 8. The output signals θ of the IIR filter are representative of the thermal state of the power system and are applied to the input of a comparison circuit 7 for comparison to tripping thresholds. The comparison circuit 7 may comprise time delays and supplies a tripping signal Sd if the quantity θ is greater than a preset threshold for the duration of the corresponding time delay.

Figure 3:
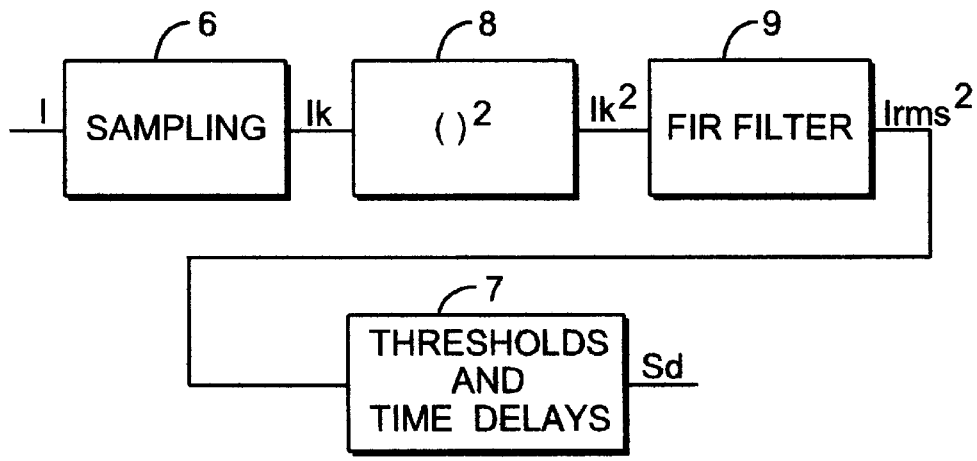

In the embodiment of the processing circuit of FIG. 3, the output of the sampling circuit 6 is connected to the input of a squaring circuit 8 whose output is connected to the input of a digital finite impulse response filter 9, or FIR filter. The output signals of the FIR filter 9 are representative of the square $Irms^2$ of the rms value of the current flowing in the power system. The comparison circuit 7 supplies a tripping signal if the square of the rms value of the current is greater than a preset threshold for the duration of the corresponding time delay.

Figure 4:
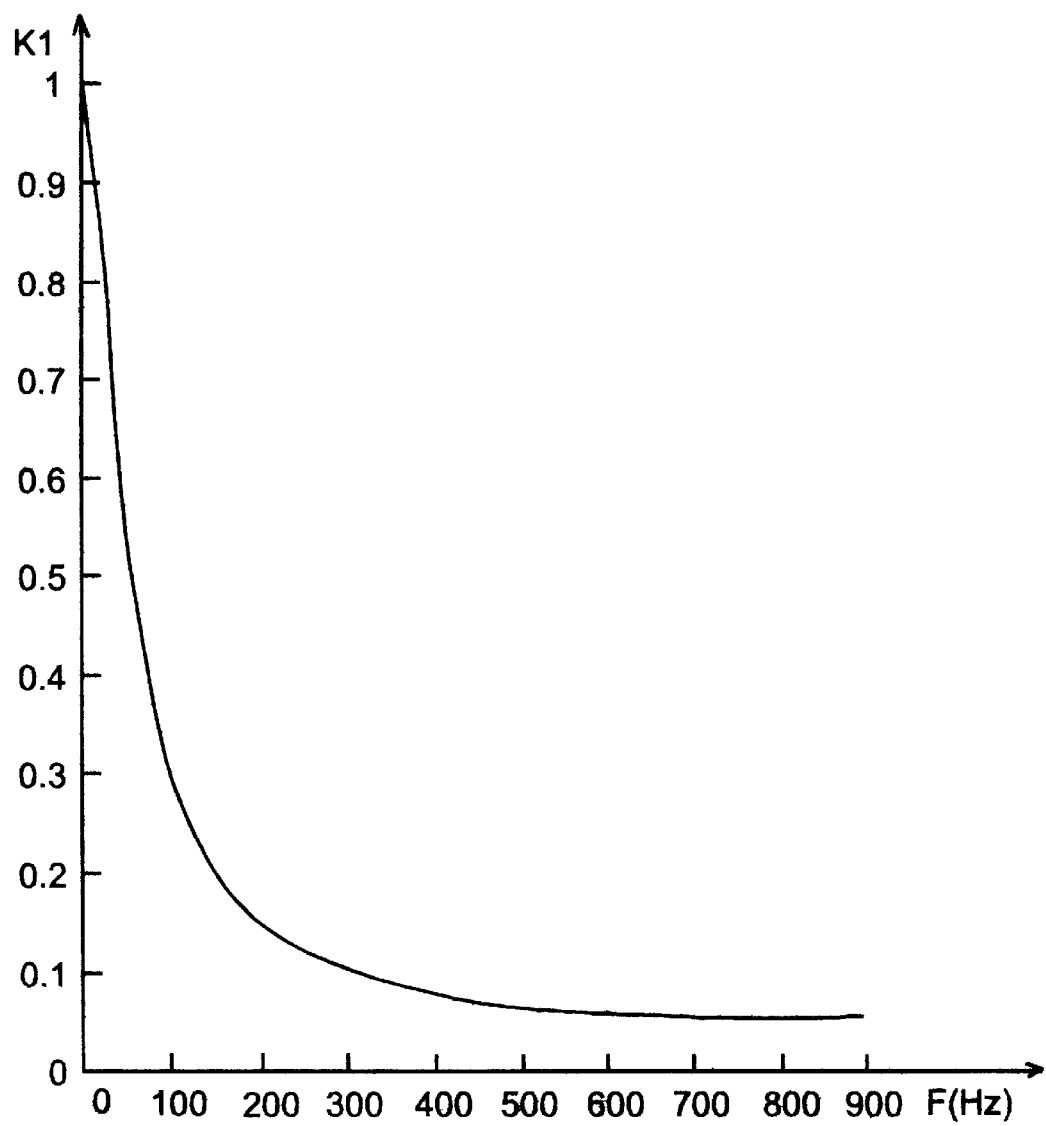
FIGS. 4 and 5 respectively illustrate the frequency responses of the transfer functions K1 and K2 of the filters according to FIGS. 2 and 3, respectively for sampling frequencies of 1600 Hz and 800 Hz.

The frequency response of the transfer function K1 of the IIR filter 5 of FIG. 2 is illustrated in FIG. 4 for a sampling frequency of 1600 Hz. The transfer function K1 has the form:

$$K1 = |\alpha 1 / [1 + (\alpha 1 - 1)e^{-j2\pi F \cdot Te}]|$$

where F is the frequency, α1 a constant such that: $\alpha 1 = Te/\tau$, τ being the time constant of the filter 5 and Te the sampling period.

The IIR filter 5 recalculates a new value θk of θ at each sample Ik from the previously calculated value of θk−1 and the new sample Ik.

The frequency response K1 is acceptable as it correctly attenuates not only the 50 Hz harmonics, but the 60 Hz and 400 Hz harmonics as well.

Figure 5:
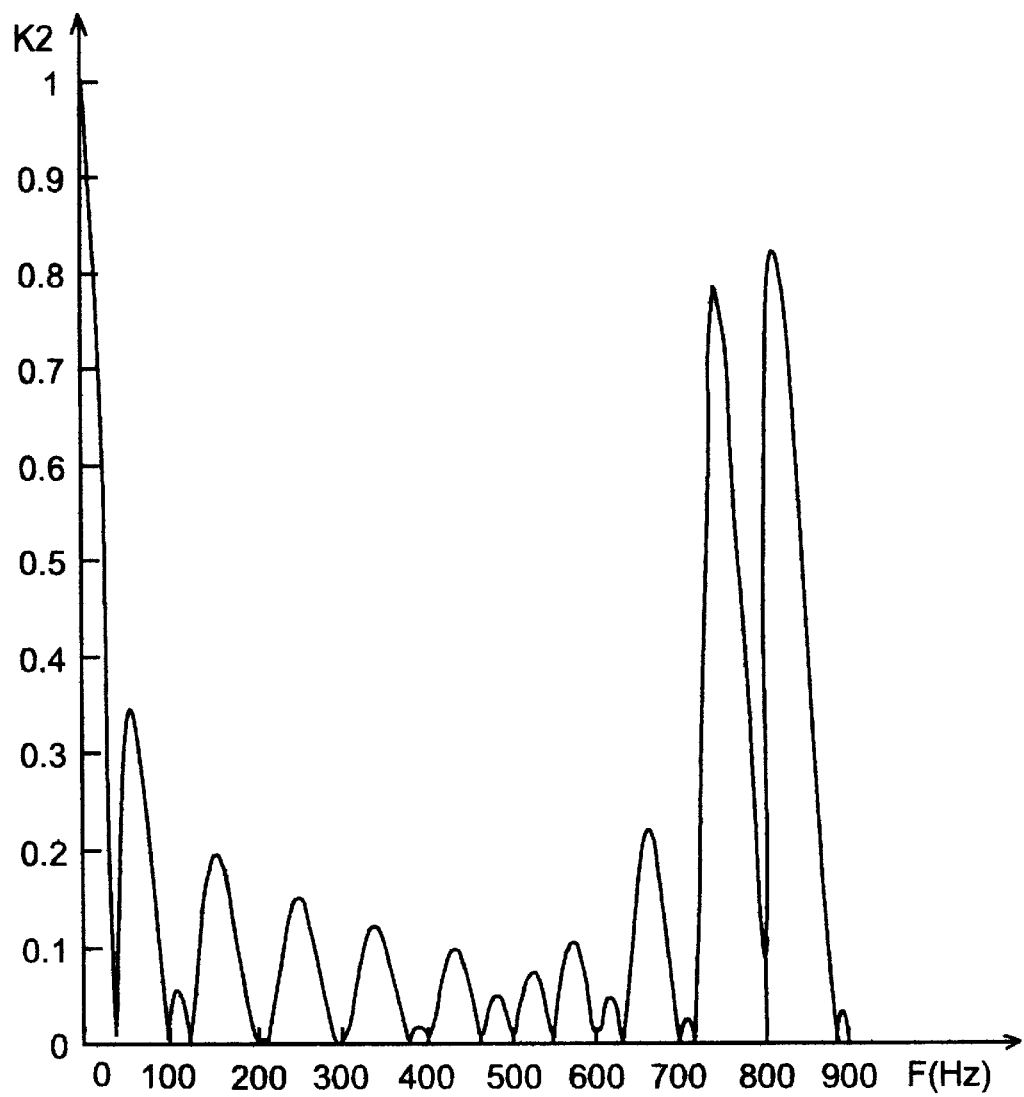

FIG. 5 represents the frequency response of the transfer function K2 of the FIR filter 9 of FIG. 3, for a sampling frequency of 800 Hz and an rms value calculation using 16 samples. In addition, in known manner, a time delay period td of a few milliseconds, 1.9 ms in the embodiment represented, is added to the sampling period Te after each group of 8 samples. Such a delay enables both the 50 Hz and the 60 Hz harmonics to be filtered. The transfer function F2 has the form:

$$K2 = \left| \sum_{k=0}^{7} e^{-j2\pi FkTe} + \sum_{k=0}^{7} e^{-j2\pi F(Te(k+8)+td)} \right| / 16$$

Attenuation of the harmonics can be considered as being satisfactory with the sampling frequency chosen, 800 Hz, lower than the sampling frequency associated to K1. However, the circuit according to FIG. 3 does not enable the actual heat rise of the power system conductors to be taken into account. Different results are moreover obtained depending on whether the circuit according to FIG. 2 or that according to FIG. 3 is used.

Figure 6:
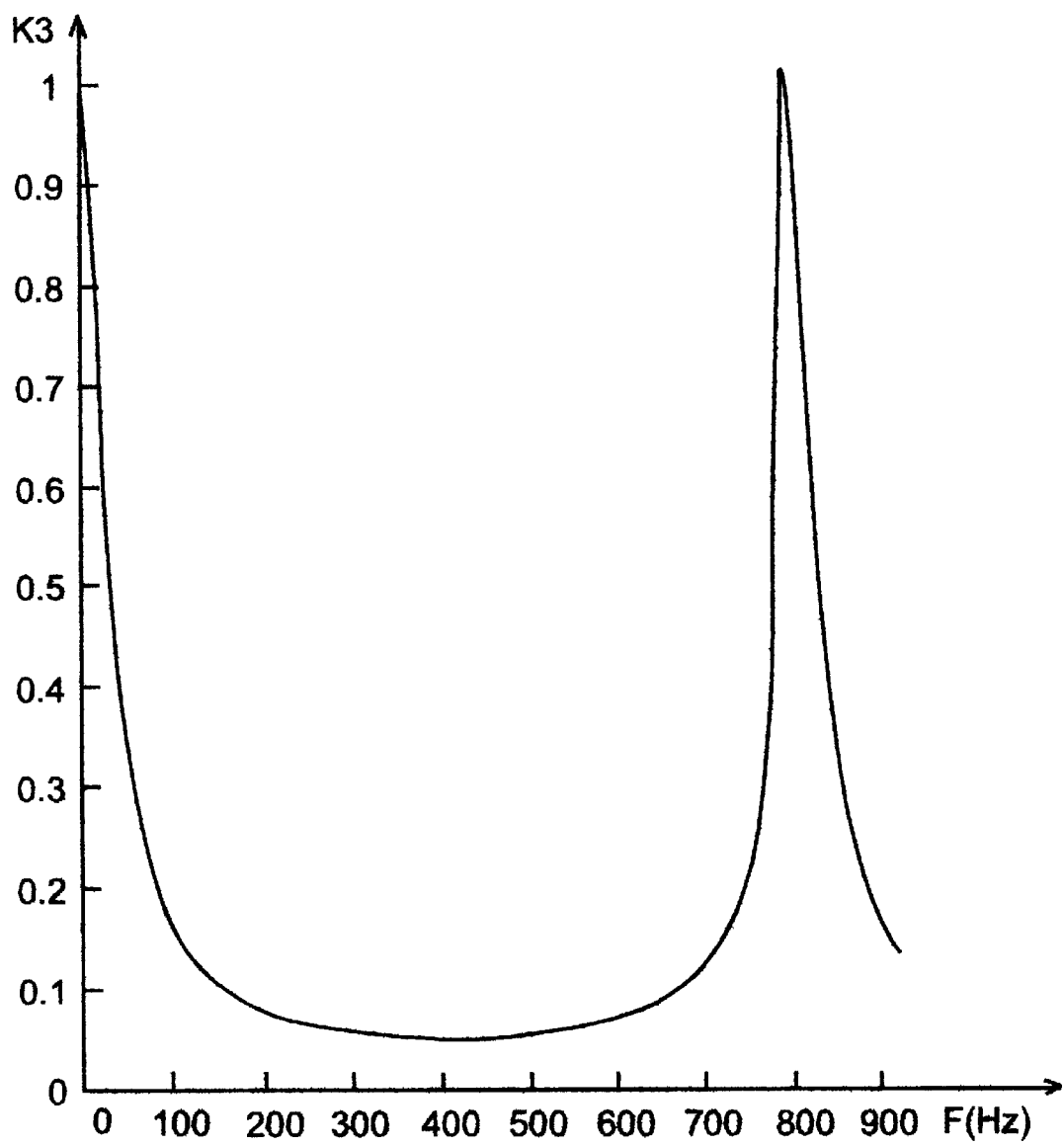
FIG. 6 represents the frequency response of the transfer function K3 of a filter according to FIG. 2 for a sampling frequency of 800 Hz.

Furthermore, if the sampling frequency in an IIR filter circuit according to FIG. 2 is decreased, the frequency response becomes unsatisfactory. Such a response is, for example, illustrated in FIG. 6, with a sampling frequency of 800 Hz. It is clear that the 400 Hz harmonics, notably, are not at all attenuated.

According to the invention, a quite satisfactory frequency response can be obtained with a sampling frequency much lower than that (1600 Hz) used up to now with an IIR type filter, for example with a sampling frequency of about 900 Hz.

Figure 7:
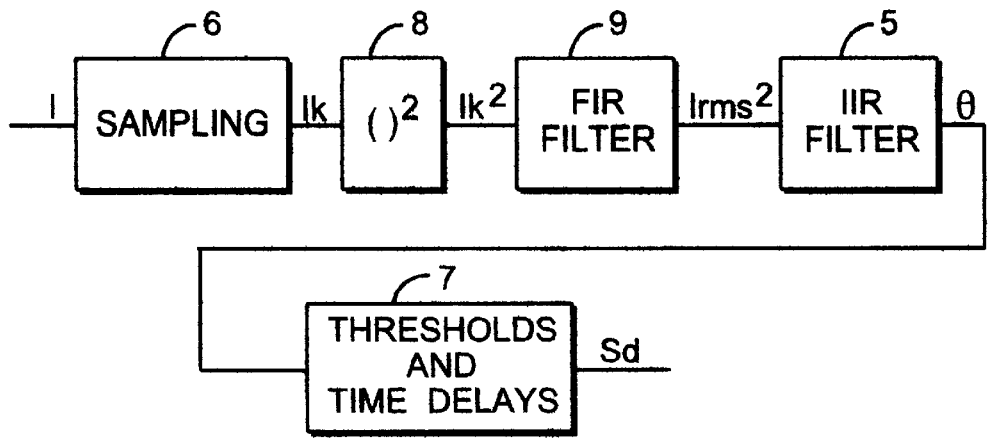
FIG. 7 illustrates a particular embodiment of the processing circuit corresponding to a phase of a trip device according to the invention.

The processing circuit according to FIG. 7 comprises a FIR filter 9 and an IIR filter 5 in series between the squaring circuit 8 and the comparison circuit 7.

Figure 8:
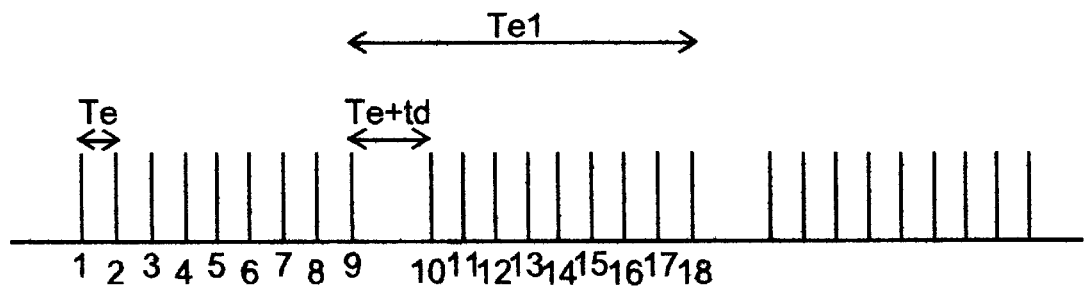
FIG. 8 illustrates the succession of samples applied to the input of the finite impulse response filter (FIR) of the circuit according to FIG. 7.

As represented in FIG. 8, the sampling circuit 6 supplies samples Ik, k=1 to 9 with a period Te corresponding to a sampling frequency Fe of 900 Hz. Then a time delay period td=2.4 ms is added to the sampling period and a new group of 9 samples Ik, k=10 to 18 is produced before a new delay.

The transfer function K'2 of the filter 9 is of the form:

$$K'2 = \left| \sum_{k=1}^{9} e^{-j2\pi F \cdot kTe} + \sum_{k=1}^{9} e^{-j2\pi F(Te(k+9)+td)} \right| / 18$$

with Te=1/Fe=1/900 td=2.4 ms

The FIR filter 9 calculates a new value $Irms^2 i$ of the square $Irms^2$ of the rms value of the current after each group of 9 successive samples, using the last 18 samples, i.e. a number of samples twice that comprised between two successive time delays. The calculation period Te1 of $Irms^2$ is given by:

$Te1=9Te+td=12.4ms$

This period Te1 corresponds to a sampling frequency Fe1<<Fe on input of the IIR filter 5. The IIR filter calculates a new value θi of θ at each new calculation of $Irms^2$, i.e. with the frequency Fe1, close to 80 Hz.

The transfer function K'1 of the IIR filter 5 of FIG. 7 has the form:

$$K'1 = |\alpha 2 / [1 + (\alpha 2 - 1)e^{-j2\pi F \cdot Te1}]|$$

Figure 9:
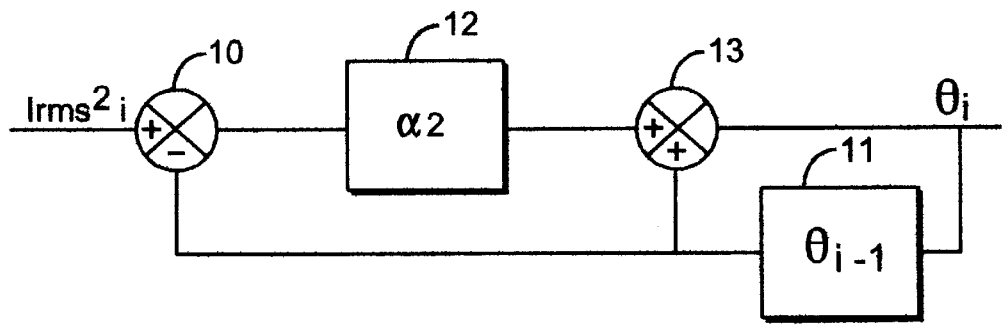
FIG. 9 illustrates, in greater detail, a particular embodiment of the infinite impulse response filter of the circuit according to FIG. 7.

Such a transfer function can be achieved, as illustrated in FIG. 9. The value $Irms^2 i$ is applied to a "+" input of an operator 10 which receives a "−" input the value θi−1 previously calculated and stored in a circuit 11. The difference $Irms^2 i$−θi−1 is applied to the input of an operator 12 which multiplies it by the constant α2. The product α2 ($Irms^2 i$−θi−1) is applied to a "+" input of an operator 13 which receives the value θi−1 on another "+" input. The output θi of the operator 13 then has the form:

θ=θi−1+α2($Irms^2 i$)−θi−1)

Figure 10:
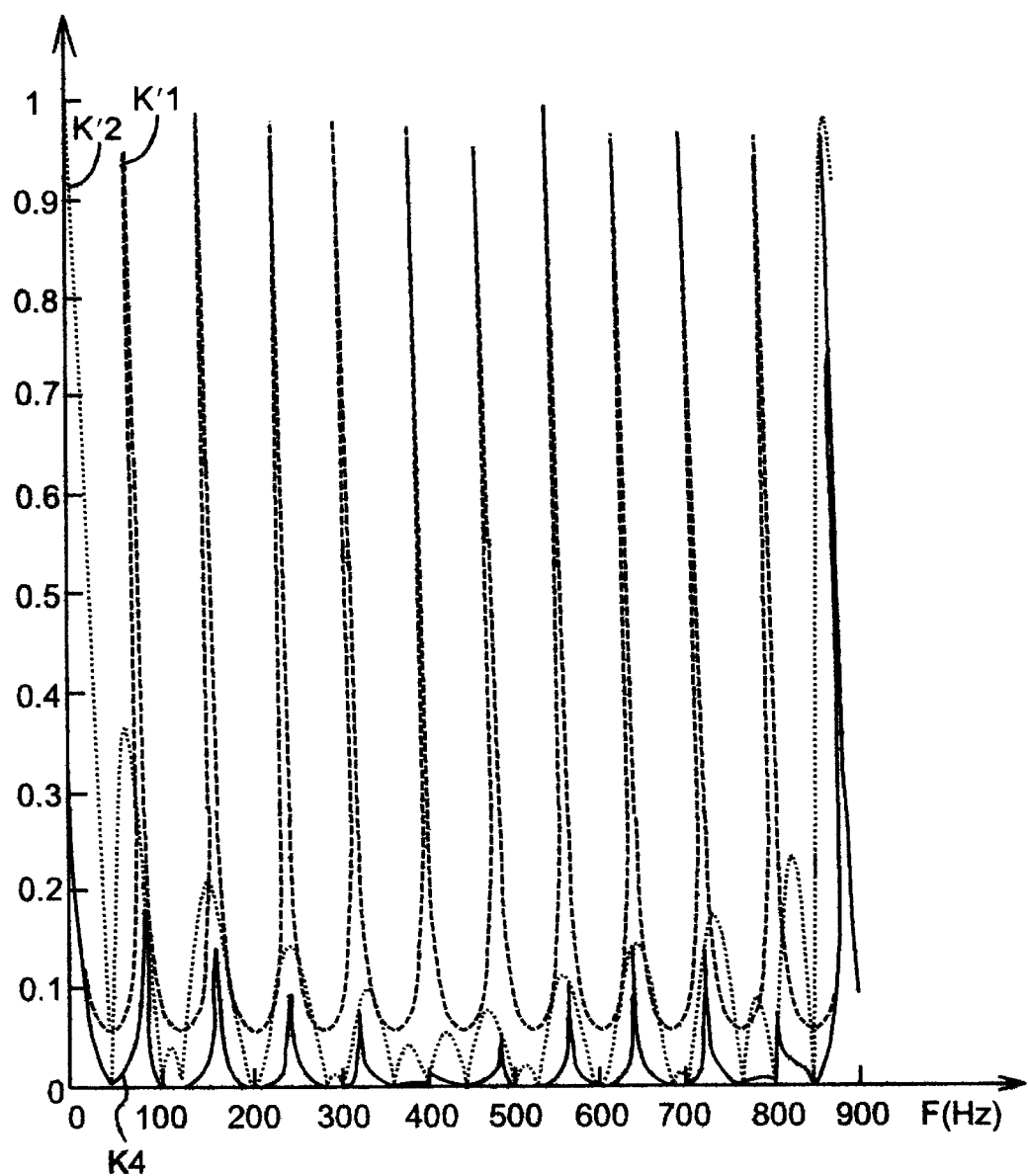
FIG. 10 represents the frequency response of the transfer functions K'1, K'2 and K4 respectively of the infinite impulse response filter, of the finite impulse response filter, and of the set of two filters of the circuit according to FIG. 7, for a sampling frequency of 900 Hz.

The frequency responses K'1 of the IIR filter 5, K'2 of the FIR filter 9, and K4 of the set of two filters in series of FIG. 7 are illustrated in FIG. 10.

It is clearly apparent from FIG. 10 that the frequency response of the transfer function K4 satisfactorily attenuates the 50 Hz harmonic, and also the 60 Hz and 400 Hz harmonics.

Sampling and calculation must be performed at precise time intervals. For this, these functions are performed by the microprocessor of the processing circuit by interrupt.

Figure 11:
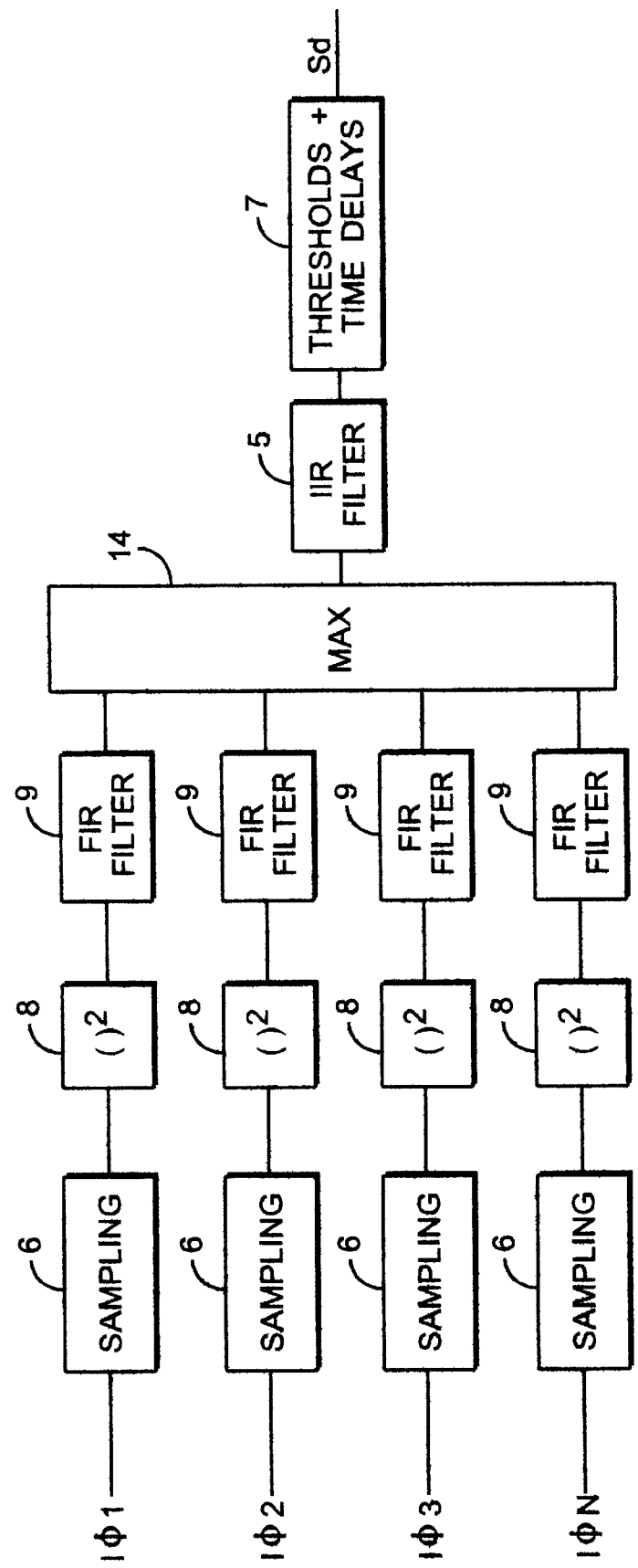
FIG. 11 represents a particular embodiment of the invention in the case of a polyphase power system.

The power system being polyphase, for example three-phase, with or without neutral, a FIR filter is associated to each phase and possibly to the neutral. However, if an IIR filter is also associated to each phase, the computing power required once more becomes high. In the particular embodiment of FIG. 11, the processing circuit of a trip device associated to a three-phase power system with neutral comprises a sampling circuit 6, a squaring circuit 8 and a FIR filter 9 associated to each phase φ1, φ2, φ3 and to the neutral N. A maximum circuit 14 is connected to the output of the FIR filters 9. It supplies on output signals representative of the square of the rms value of the highest current taken from the phase currents Iφ1, Iφ2, Iφ3 and the neutral current IN. The trip device comprises a single IIR filter 5 connected to the output of the circuit 14 and a comparison circuit 7 connected to the output of the filter 5. A good cost/precision compromise is thus obtained.

If protection of the neutral conductor N is not required, the FIR filter 9 associated to this neutral conductor can be omitted.

We claim:

1. An electronic trip device connected to means for measuring the current flowing in a polyphase electrical power system to be protected and comprising means for sampling current signals supplied by the means for measuring, means for calculating connected to the means for sampling and calculating a quantity representative of the thermal state of the power system, and means for comparing said quantity to preset tripping thresholds, the means for calculating comprising first means for filtering, receiving the current signal samples and supplying signals representative of the rms value of the current, a trip device wherein said first means for filtering comprise a finite impulse response filter associated to each phase of the power system, a maximum circuit connected to the output of each finite impulse response filter, and an infinite impulse response filter, having an input connected to the output of the maximum circuit and an output connected to the means for comparing.

2. The trip device according to claim 1, wherein the means for calculating comprise a first finite impulse filter associated to a neutral conductor of the power system and connected to the maximum circuit.

3. The trip device according to claim 1, wherein the means for sampling add a time delay period between two successive samples after a preset number of current samples.

4. The trip device according to claim 1, wherein the first filtering means periodically calculate a new rms value of the current after a first preset number of current samples, calculation being performed from a second number of samples equal to twice the first number.

5. The trip device according to claim 4, wherein the infinite impulse response filter calculates a new value of the thermal quantity from each new rms value of the current supplied by the first filtering means.

6. The trip device according to claim 4, wherein the first preset number of current samples is 9.

7. The trip device according to claim 1, wherein the sampling means operate at a sampling frequency of about 900 Hz.

8. The trip device according to claim 3, wherein the time delay period is a few milliseconds.

\* \* \* \* \*